(12) United States Patent
Cui et al.

(10) Patent No.: US 7,728,433 B2
(45) Date of Patent: Jun. 1, 2010

(54) DIELECTRIC BARRIER LAYER FOR INCREASING ELECTROMIGRATION LIFETIMES IN COPPER INTERCONNECT STRUCTURES

(75) Inventors: Hao Cui, Gresham, OR (US); Peter A. Burke, Portland, OR (US); Wilbur G. Catabay, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/736,402

(22) Filed: Apr. 17, 2007

(65) Prior Publication Data

US 2007/0190784 A1 Aug. 16, 2007

Related U.S. Application Data

(62) Division of application No. 10/414,601, filed on Apr. 15, 2003, now Pat. No. 7,276,441.

(51) Int. Cl.
*H01L 29/40* (2006.01)
(52) U.S. Cl. .................... 257/751; 257/762; 257/767
(58) Field of Classification Search .......... 257/750–775
See application file for complete search history.

(56) References Cited

U.S. PATENT DOCUMENTS

| 5,926,740 | A | 7/1999 | Forbes et al. |
|---|---|---|---|
| 6,153,523 | A | 11/2000 | Van Ngo et al. |
| 6,528,423 | B1 | 3/2003 | Catabay et al. |
| 6,759,327 | B2 | 7/2004 | Xia et al. |
| 6,764,958 | B1 | 7/2004 | Nemani et al. |
| 2003/0042613 | A1 | 3/2003 | Shioya et al. |
| 2003/0134495 | A1 | 7/2003 | Gates et al. |
| 2004/0005775 | A1 | 1/2004 | Chou et al. |
| 2004/0124532 | A1 | 7/2004 | Harada |
| 2004/0140289 | A1 | 7/2004 | Su et al. |

*Primary Examiner*—Richard A. Booth
(74) *Attorney, Agent, or Firm*—Beyer Law Group LLP

(57) ABSTRACT

Embodiments of the invention include a copper interconnect structure having increased electromigration lifetime. Such structures can include a semiconductor substrate having a copper layer formed thereon. A dielectric barrier stack is formed on the copper layer. The dielectric barrier stack includes a first portion formed adjacent to the copper layer and a second portion formed on the first portion, the first portion having improved adhesion to copper relative to the second portion and both portions are formed having resistance to copper diffusion. The invention also includes several embodiments for constructing such structures. Adhesion of the dielectric barrier stack to copper can be increased by plasma treating or ion implanting selected portions of the dielectric barrier stack with adhesion enhancing materials to increase the concentration of such materials in the stack.

14 Claims, 6 Drawing Sheets

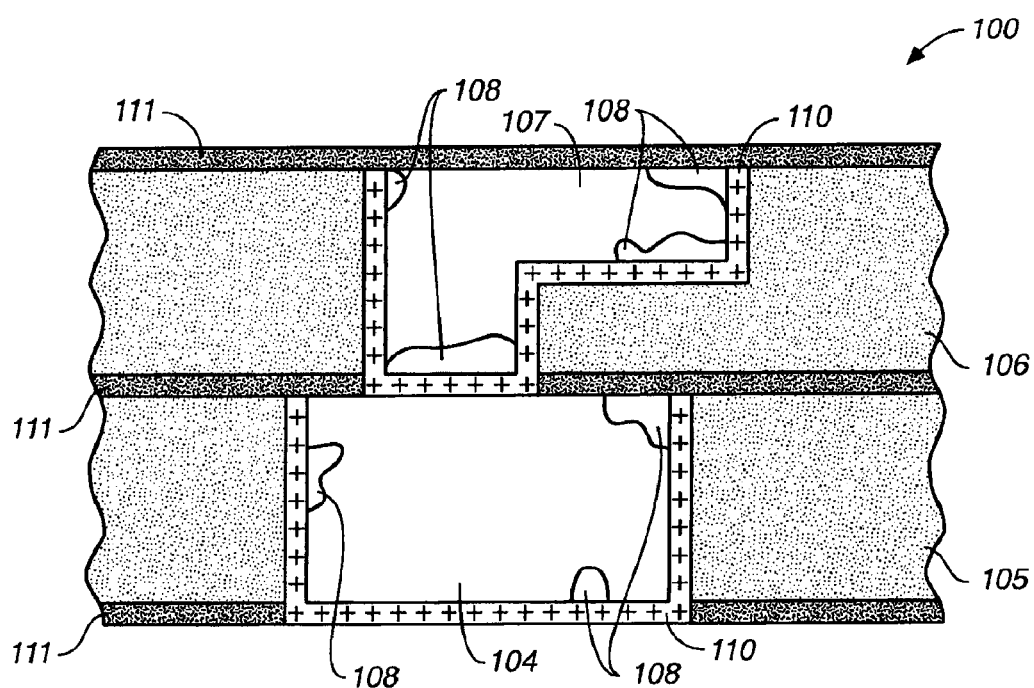
FIG._1a
*(PRIOR ART)*
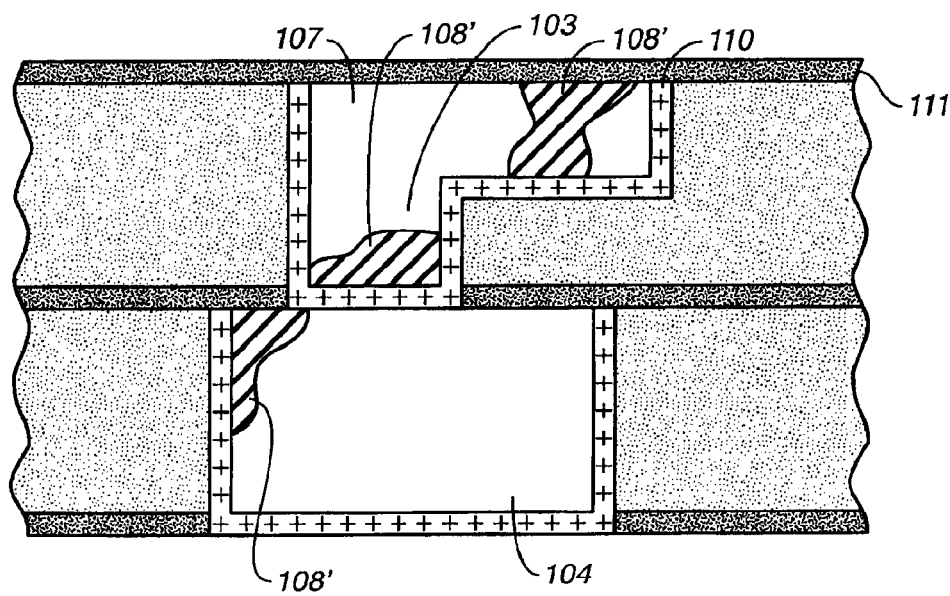
FIG._1b
*(PRIOR ART)*

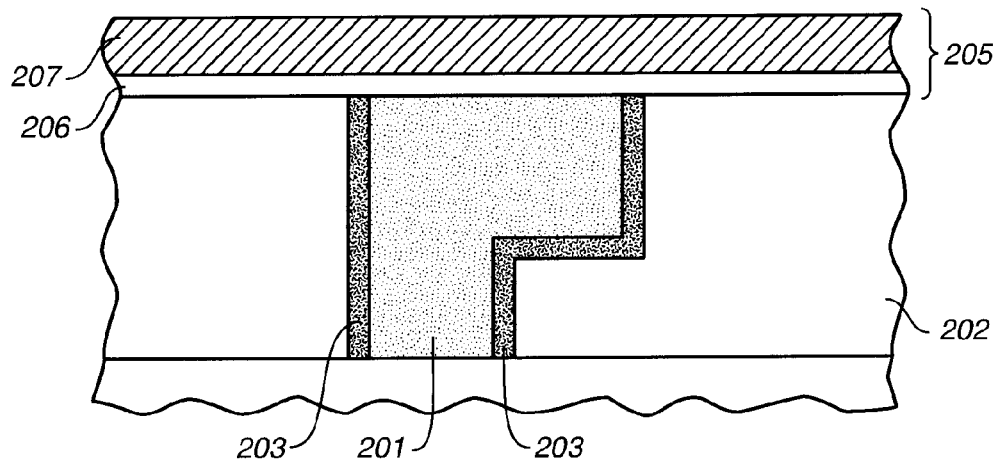
FIG._2
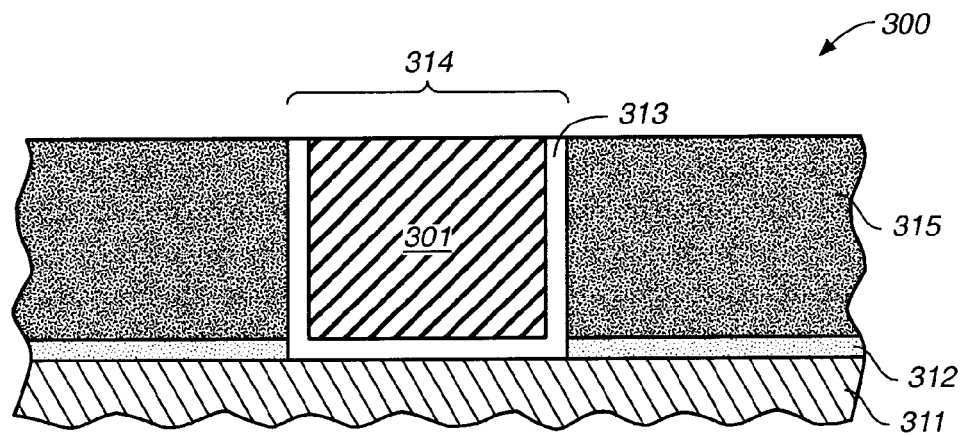
FIG._3a
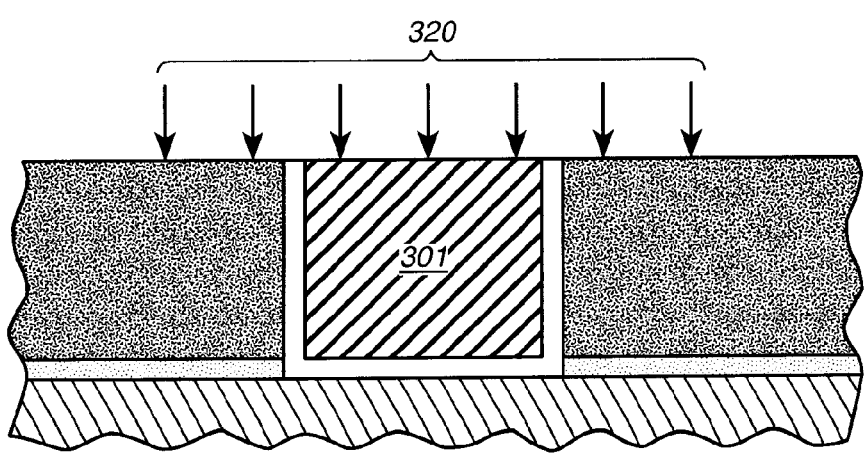
FIG._3b

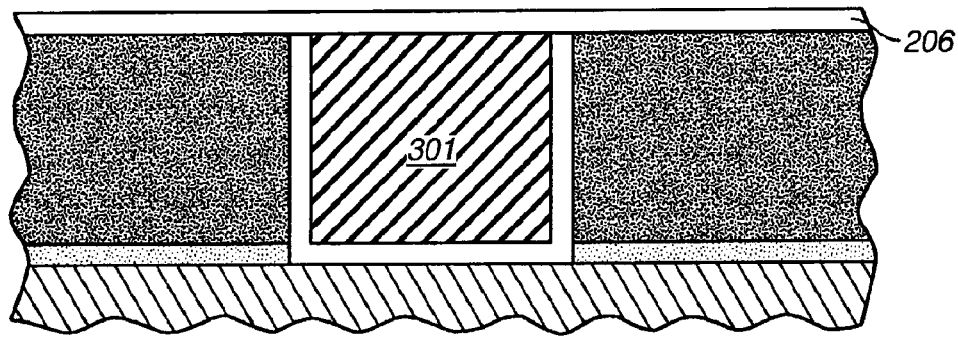
FIG._3c
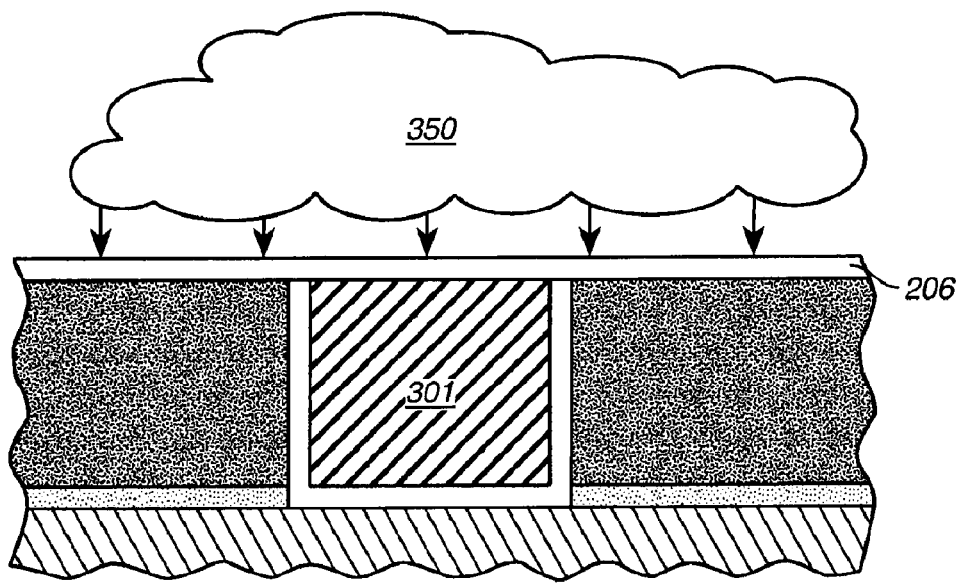
FIG._3d
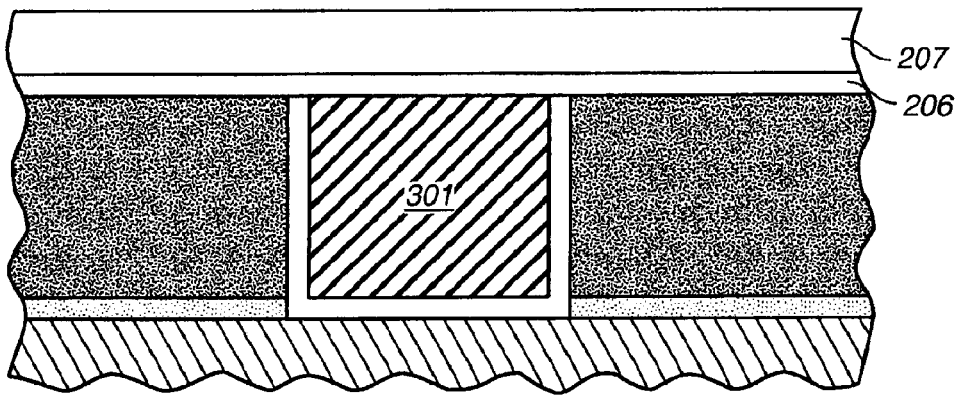
FIG._3e

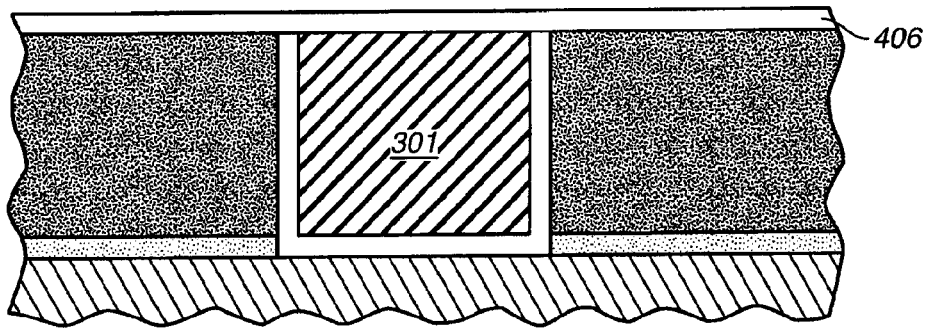
FIG._4a
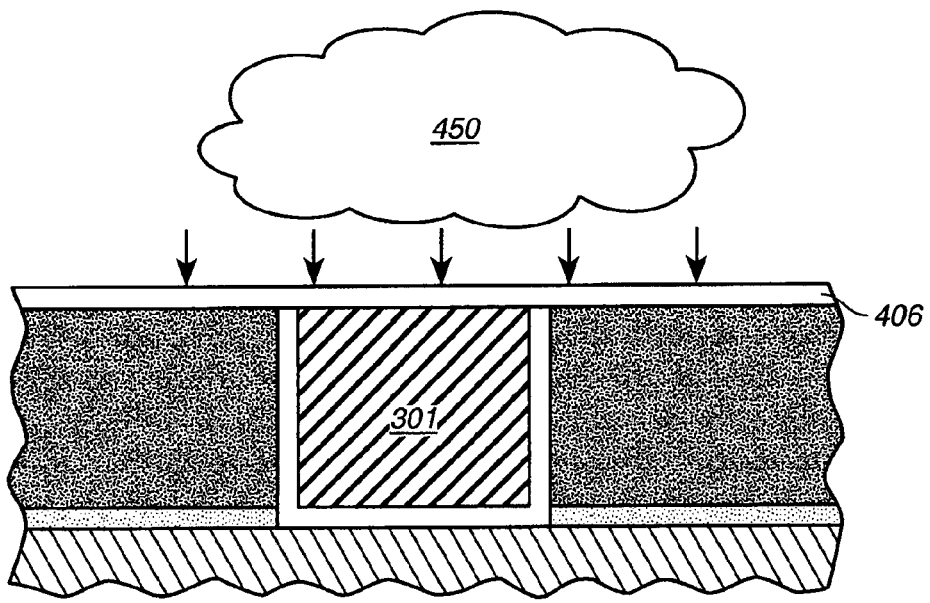
FIG._4b
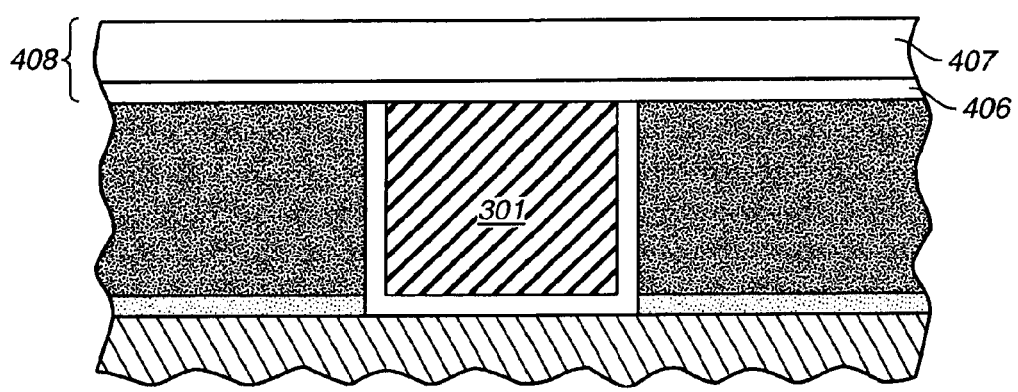
FIG._4c

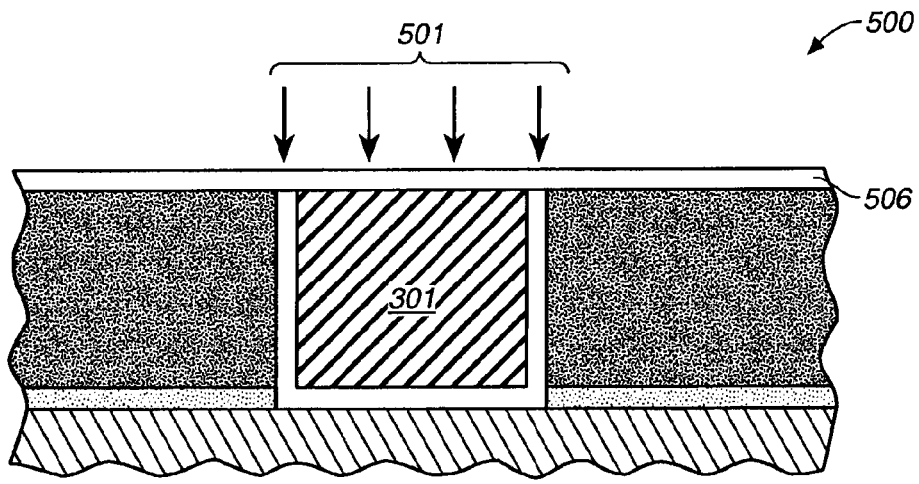
*FIG._5a*
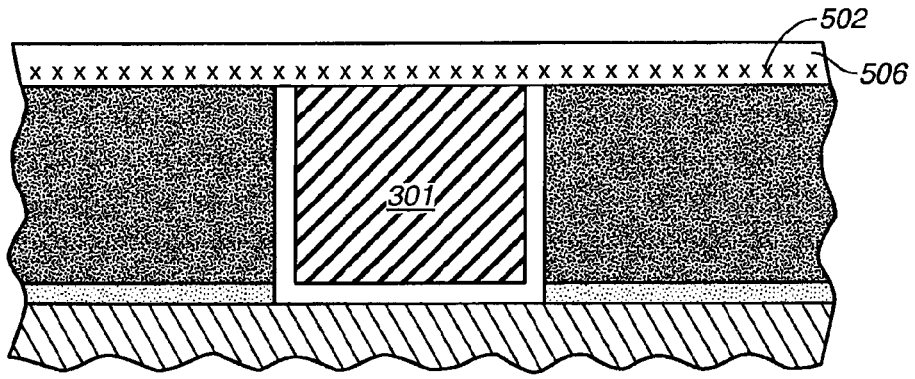
*FIG._5b*
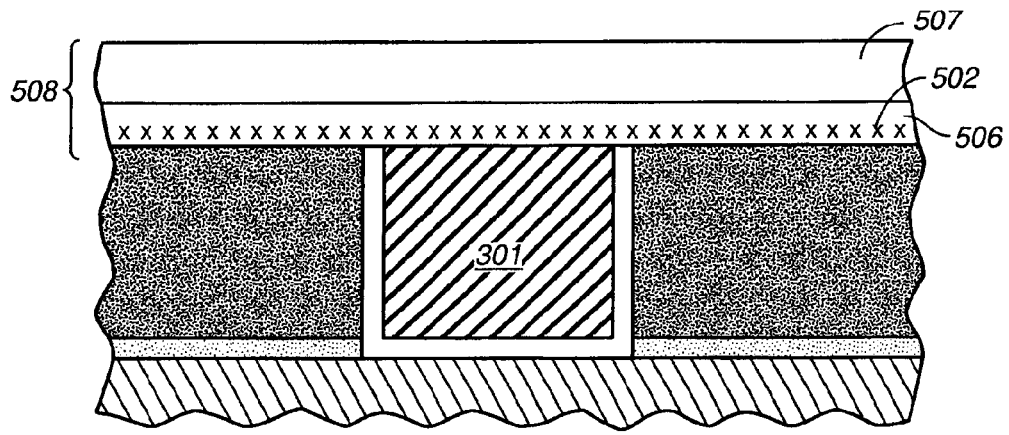
*FIG._5c*

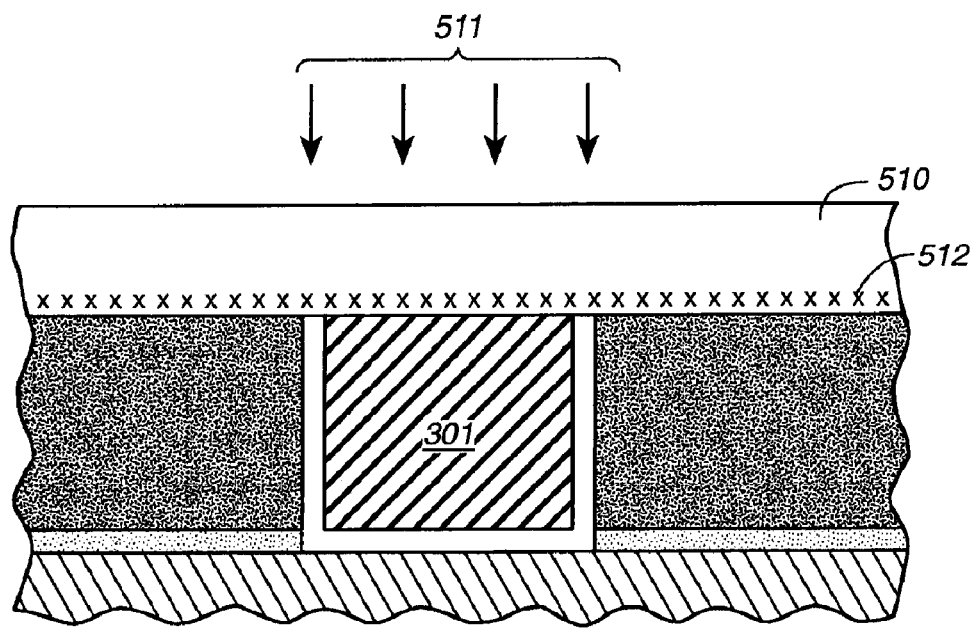
FIG._5d
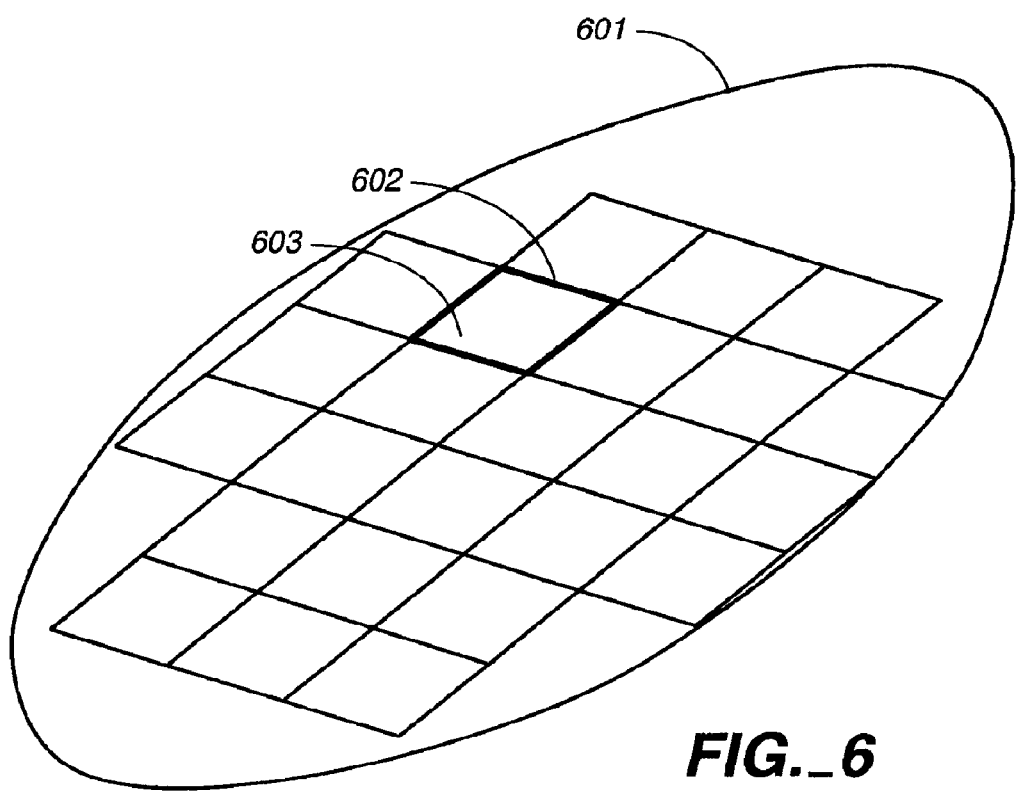
FIG._6

US 7,728,433 B2

DIELECTRIC BARRIER LAYER FOR INCREASING ELECTROMIGRATION LIFETIMES IN COPPER INTERCONNECT STRUCTURES

RELATED APPLICATION

This is a Divisional application of U.S. application Ser. No. 10/414,601, entitled "DIELECTRIC BARRIER LAYER FOR INCREASING ELECTROMIGRATION LIFETIMES IN COPPER INTERCONNECT STRUCTURES", filed on Apr. 15, 2003 now U.S. Pat No. 7,276,441, which is incorporated herein by reference and from which priority under 35 U.S.C. §120 is claimed.

TECHNICAL FIELD

The invention described herein relates generally to semiconductor devices and processing. In particular, the invention relates to semiconductor structures and processes that can be incorporated into improved copper interconnection structures having longer electromigration lifetimes. And most particularly, the invention relates forming an improved dielectric barrier layers formed on copper metal lines and layers.

BACKGROUND

The semiconductor industry has moved ever increasingly to copper conductive lines and interconnect structures in the construction of semiconductor devices. Copper has proven to be a very useful material. Especially, advantageous is the low resistivity relative to other comparable process materials (e.g., aluminum). As a result, copper circuitry suffers less from resistance-capacitance (RC) delays. This makes copper systems faster.

However, copper materials have the disadvantage of high diffusivity through dielectric and silicon materials on which the copper is deposited. This is especially problematic when copper is used with so-called low-κ dielectric materials, which are coming into increasingly common usage. Diffusion of copper into insulating layers comprised of low-κ dielectric materials can result in serious problems. Diffusion of copper into low-κ materials degrades the dielectric performance of such materials and commonly leads to device failure. The industry has adapted to this problem by implementing a wide range of barrier layers to prevent the diffusion of copper into the affected materials. Typically, the barrier layers consist of thin layers of barrier material interposed between copper layers and low-κ dielectric layers.

Although such barrier layers are effective at preventing the diffusion of copper materials, such barrier layers suffer from their own set of difficulties. One such problem is that barrier layers can contribute to electromigration induced voiding in copper interconnect structures. Such voiding is a common source of circuit failure in copper based semiconductor structures. Such voiding is particularly problematic when it occurs in via structures. Research has shown that electromagnetic voiding is particularly common at the interface between the copper layer and the barrier layer.

This problem can be illustrated with reference to the schematic cross-section views illustrated in FIG. 1(a) and FIG. 1(b). In FIG. 1(a), a conventional multi-level semiconductor substrate 100 is depicted. A wafer surface is depicted with a copper line 104 formed therein. The copper line 104 is typically formed using copper or copper-containing materials (e.g., copper alloys or copper laminates and the like). Insulating layers 105, 106 comprised of electrically insulating material (e.g., SiO$_2$, low-κ dielectrics, and other like materials) are formed on the wafer surface to provide dielectric insulation between metal lines and between layers. Other copper layers 107 are used to electrically interconnect the various layers of an IC through via or other electrical connection structures. In the depicted example, a copper layer 107 is formed in an opening formed in the insulating layer 105. The opening exposes underlying copper line 104. Such openings are commonly formed using damascene or dual-damascene fabrication processes. However, when copper is used in such processes, barrier layers are used to prevent copper from diffusing out of its intended location so that the copper does not "poison" the low-κ layers used in such semiconductor structures.

These barrier layers take the form of refractory metal barrier layers 110 and so-called dielectric barrier layers 111. Commonly, refractory metal barrier layers (metal barrier layers) 110 include refractory metals in their construction. Such refractory metal barrier materials can include tantalum (Ta) or titanium (Ti) based barrier materials (e.g., tantalum nitrides (TaN), tantalum silicon nitrides (TaSiN), or titanium nitrides (TiN)). Additionally, multi-layer refractory metal barrier layers can be formed. Also, graded metal barrier layers can be used.

Additionally, so-called dielectric barrier layers are used. Such dielectric barrier layers prevent copper diffusion but do not incorporate refractory metals in their construction. Typical examples of such dielectric barrier layers are formed of dielectric materials that include silicon carbide and silicon carbon nitride. Such materials generally have a relatively lower dielectric constant (κ) than the refractory metal barrier layers. However, it would be desirable to make use of dielectric barrier layers that have lower effective κ values.

Others have discovered that copper layer and line commonly include minute voids 108. Others have also discovered that during the ordinary operation of integrated circuit devices, copper atoms migrate within the copper lines 104 and layers 107. One of the unfortunate byproducts of such copper migration is that the voids 108 in the copper layers and lines also tend to migrate. Moreover, at certain points in such lines and layers the voids also tend to aggregate causing large "macrovoids" that can cause serious problems for circuit operation. If such macrovoids become large enough and form in the wrong locations they can and do cause circuit failure. One of the major pathways for such copper migration and macrovoid formation is at the interfaces between the copper layers (and lines) and the copper diffusion barrier layers (e.g., the metal and dielectric barrier layers).

FIG. 1(b) shows one of the problems circuits undergo when copper migration causes the voids 108 to move. In the depicted embodiment, the voids 108 have migrated and aggregated to form macrovoids 108' that are large enough to cause the depicted interconnect structure to fail. As depicted, the aggregate size of the macrovoids 108' can become quite sizable reducing current through regions having voids. As depicted, the problem becomes even worse when macrovoids 108' migrate to narrow regions on in the semiconductor circuitry. As depicted in FIG. 1(b) a macrovoid 108' has migrated to occlude the conduction pathway 103 (e.g., a via). In short, the macrovoid 108' has migrated to the interface between the copper layer 107 (e.g., a via) and the metal line 104. Also, the macrovoid 108' has grown so large that it destroys the current path between the copper layer 107 and the metal line 104. Moreover, such voiding problems are known to become worse when low κ materials are used. Current solutions to this problem require that a secondary via be constructed so that when one via fails a conduction path can still be achieved through the secondary via. Although such solutions work well enough for their intended purpose, improved solutions are desirable.

SUMMARY OF THE INVENTION

In accordance with the principles of the present invention, an improved interconnection structure and method for its fabrication are disclosed.

In general, the present invention is directed toward methods and structures for constructing copper interconnect structures having increased electromigration lifetimes and a lower incidence of void induced circuit failures. Such structures include a dielectric barrier stack formed on the copper material. A first portion of the stack has good adhesion to the copper. The second portion has a low κ value relative to the first portion. Preferably, both portions operate as diffusion barriers to copper. Such dielectric barrier stacks are constructed to achieve good adhesion to copper and have a low overall effective κ value while providing an effective diffusion barrier to copper. The resultant structure improves the electromigration lifetimes of associated copper layers and lines.

One embodiment of the invention includes a method for forming a copper interconnect structure. The method involves providing a substrate having a copper layer formed thereon. A dielectric barrier stack is then formed on the copper layer. A portion of the dielectric barrier stack is treated with an adhesion enhancing materials to enhance the adhesion of the dielectric barrier stack to the copper layer.

In another related embodiment, the method of forming the dielectric stack comprises forming a first dielectric barrier layer and then plasma treating the first layer with plasma that contains adhesion enhancing materials. A second dielectric barrier layer is then formed on the plasma-treated first dielectric barrier, thereby completing the stack.

In another related embodiment, the method of forming the dielectric stack comprises forming a first dielectric barrier layer and then ion implanting the first layer of dielectric barrier material with adhesion enhancing materials. A second dielectric barrier layer is then formed on the ion implanted first dielectric barrier, thereby completing the stack.

In another related embodiment, the method of forming the dielectric stack comprises forming a dielectric barrier layer and then ion implanting the dielectric barrier layer with adhesion enhancing materials so that a portion of the dielectric barrier layer closest to the underlying copper layer has an increased density of adhesion enhancing materials thereby increasing the adhesion of the dielectric barrier layer to the underlying copper layer.

Another embodiment involves a novel copper interconnect structure having increased electromigration lifetime. Such a structure includes a semiconductor substrate having a copper layer formed thereon. A dielectric barrier stack is formed on the copper layer. The dielectric barrier stack includes a first portion formed adjacent to the copper layer and a second portion formed on the first portion, the first portion having improved adhesion to copper relative to the second portion and the second portion having a lower κ value than the first portion. Both portions are formed having resistance to copper diffusion.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIGS. 1(a) and 1(b) are simplified schematic cross-section views of a conventional copper interconnect structure illustrating the problem of electromigration induced void failures in conventional circuit structures.

FIG. 2 is a simplified cross-sectional view of semiconductor interconnect structure implementing a generalized embodiment of an improved dielectric barrier stack in accordance with the principles of the invention.

FIGS. 3(a)-3(e) are simplified cross-sectional views of semiconductor substrate illustrating a structure embodiment and process embodiment in accordance with the principles of the invention.

FIGS. 4(a)-4(c) are simplified cross-sectional views of semiconductor substrate illustrating another structure and process embodiment in accordance with the principles of the invention.

FIGS. 5(a)-5(d) are simplified cross-sectional views of semiconductor substrate illustrating more structure and process embodiments in accordance with the principles of the invention.

FIG. 6 is a simplified figurative depiction of a semiconductor wafer formed having interconnect structures and improved dielectric barrier layers of the type described herein comprising part of its circuitry in accordance with the principles of the invention.

It is to be understood that in the drawings like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various method embodiments for forming conducting structures in semiconductor devices will be disclosed. In particular, the depicted structures show the formation of copper conducting structures and improved dielectric barrier layers that are suitable for use in a number of different modes. Particularly, such improved dielectric barrier layers find utility when used with the interconnecting copper lines of multi-layer semiconductor devices. The inventors specifically contemplate that the principles of the invention are not strictly confined to copper materials but that they can also be applied to copper-containing materials as well (e.g., copper alloys and laminated copper structures that include more than just pure copper). The inventors also contemplate that the principles of the invention are not limited to just interconnect and via structures, but that they can also be applied to any interconnections between copper-containing conducting structures in a semiconductor substrate.

Referring again to FIG. 1(b), it has been determined that one of the keys to suppressing the occurrence of void induced circuit failure in copper interconnect structures is the formation of barrier layers having improved adhesion to copper materials. One common site for copper electromigration leading to void failure is at the interface between a copper layer of line and the barrier layers ("barrier layer" is used here collectively to refer to both dielectric barrier layer and metal barrier layer). This is dramatically depicted in FIG. 1(b) which schematically illustrates voids (depicted by the crosshashed macrovoid 108') forming at the interface between the copper layer 107 and the barrier layers (here metal barrier layer 110 and dielectric barrier layer 111). As generalized proposition, the embodiments of the invention include dielectric barrier layers having improved adhesion to copper materials. Such layers improve the electromigration lifetimes of copper circuit structures.

FIG. 2 depicts one generalized embodiment, of a circuit structure incorporating an improved dielectric barrier layer. The structure includes a dielectric stack formed on a copper layer. A substrate 200 is provided and is typically constructed of a silicon wafer having one or more layers of structure formed thereon. FIG. 2 depicts only the uppermost portions of what can be a multi-layered structure. In the depicted embodiment, a copper layer 201 is formed on the substrate. In this depiction, the copper layer 201 is formed in an inlaid recess in an insulating layer 202 formed on the substrate surface. Such structures are commonly used in semiconductor fabrication. For example, such structure are commonly formed using damascene or dual-damascene fabrication processes. As depicted here, the copper layer 201 is deposited into a recess formed in an insulating layer 202 comprised of an electrically insulating material. Such insulating layers are commonly referred to as interlayer dielectric layers or ILD's. These insulating layers or ILD's 202 are formed of low-κ dielectric materials or other electrically isolating materials. The principles of the present invention find particular utility when applied to use with low-κ dielectric materials. Examples of such materials include spin-on and CVD polymeric materials based on silicon or carbon, or based on combinations of silicon and carbon. Particular low-κ materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-κ materials include SiCOH or polymers of parylene and napthalene, copolymers of parylene with polysiloxanes or teflon, and polymers of polysiloxane. Other ILD 202 materials include, but are not limited to, silicon dioxide or combinations of silicon dioxide and other doped dielectrics (e.g., BPSG, PSG).

In order to prevent the copper materials of the copper layer 201 from contaminating the ILD 202 barrier layers are used. Frequently, metal barrier layers formed of titanium (e.g., Ti, TiN, and other related materials) or tantalum (e.g., Ta, TaN, TaSiN, and other related materials) based materials are used. Also, many other materials, such as CoWP (and others) are used to provide metal barrier layers for ILD's. Additionally, dielectric barrier layers can be used. In the depicted example, metal barrier layers 203 are used and shown on the bottom and sidewalls of the recess. The use of such metal barrier layers is not critical to the practice of the present invention but they are included for completeness.

Aspects of the present invention are directed to so-called dielectric barrier layers which are also used to prevent copper from diffusing out of its intended location. As explained previously, dielectric barrier layers differ from metal barrier layers in that dielectric barrier layers do not incorporate refractory metals (W, Ti, Ta, Co, Mg, Pd, Cr, Mo, V, etc.) in their composition. Such dielectric barrier layers generally have a lower dielectric constant than do metal barrier layers. Such dielectric barrier layers are formed of materials that include, but are not limited to, amorphous hydrogenated silicon carbides; amorphous hydrogenated silicon oxycarbides; amorphous hydrogenated silicon nitrides; amorphous hydrogenated silicon carbon nitrides; certain organic polymers (e.g., BCB) as well as other dielectric barrier materials that provide a good electrical insulation between copper lines and operate as good diffusion barriers to copper. The use of such dielectric barrier materials is advantageous in many process applications In the depicted embodiment, a dielectric barrier stack 205 of the present invention is shown. Typically, the dielectric barrier stack 205 includes a first portion 206 (that lies adjacent to the copper layer 201) and a second portion 207 formed on the first portion 206. Typically, but not exclusively, the first portion 206 includes a first barrier layer 206 that is formed along the top surface of the copper layer 201. This first dielectric barrier layer 206 is formed of a dielectric material that has good adhesion to the underlying copper layer 201 and operates as a good diffusion barrier to copper. Additionally, it is helpful if the first dielectric barrier layer 206 is formed of a dielectric material having good adhesion to a subsequently formed second dielectric layer 207. Materials suitable for forming such a first dielectric barrier layer 206 include, without limitation, amorphous hydrogenated silicon carbides, amorphous hydrogenated silicon carbon nitrides, and amorphous hydrogenated silicon nitrides. Such first dielectric barrier layers 206 are preferably formed very thin, on the order of about 50 Å to about 100 Å. Although such a thin first dielectric barrier layer 206 is preferred, the invention can be practiced using thicker first dielectric barrier layers 206. Such layers can be formed using a number of different method known to persons having ordinary skill in the art. In one example, the first dielectric barrier layer 206 is formed using a PECVD technique.

The second portion 207 can comprise a second dielectric barrier layer 207 formed of a different (second) dielectric barrier material. The second dielectric barrier typically is chosen for its lower κ value relative to the first dielectric barrier layer 206. For example, second dielectric barrier layers 207 can have κ values of less than about 4. Commonly, the second dielectric barrier 207 is formed to a greater thickness than the underlying first dielectric barrier layer 206. In typical embodiments, the second dielectric barrier 207 is formed in the range of 200-1000 Å , preferably about 400 Å thick. Thus, although the stack 205 has a somewhat high κ material directly adjacent to the copper layer, in general, the overall stack 205 is characterized by lower effective κ (due to the low κ value of the substantially thicker second dielectric barrier 207).

Examples of dielectric barrier materials suitable for use in a second dielectric barrier layer 207 include, without limitation, porous amorphous hydrogenated silicon carbides and porous amorphous hydrogenated silicon nitrides. Additionally, any dielectric material having a lower κ value than the first dielectric barrier layer 206 and providing a good diffusion barrier to copper is suitable. Moreover, many other low-κ materials serve as satisfactory materials for the fabrication of second dielectric barrier layers 207. Such materials include spin-on and CVD polymeric materials based on silicon or carbon, or based on combinations of silicon and carbon. Particular low-κ materials include, but are not limited to: organic thermoplastic and thermosetting polymers such as polyimides, polyarylethers, benzocyclobutenes (BCB), polyphenylquinoxalines, polyquinolines; inorganic and spin-on glass materials such as silsesquioxanes, silicates, and siloxanes; and, mixtures, or blends, of organic polymers and spin-on glasses. Further examples of CVD low-κ materials include SiCOH or polymers of parylene and napthalene, copolymers of parylene with polysiloxanes or teflon, and polymers of polysiloxane. Other useful second dielectric barrier layer 207 materials include, but are not limited to, silicon dioxide or combinations of silicon dioxide and other doped dielectrics (e.g., BPSG, PSG). Examples of such materials include, FLARE® and SiLK®.

Other embodiments can be used to form the depicted dielectric barrier stack 205. In particular, in such embodiments a first dielectric barrier layer 206 can be formed and then plasma treated to enhance the adhesion of the first dielectric barrier layer 206 to the underlying copper layer 201. As with the embodiment discussed above, the dielectric barrier stack 205 includes a first portion 206 (that lies adjacent to the copper layer 201) and a second portion 207 formed on the first portion 206. A first barrier layer 206 is formed along the top surface of the copper layer 201. Again the first dielectric barrier layer 206 is preferably formed very thin, on the order of about 50 Å to about 100 Å. Although such a thin first dielectric barrier layer 206 is preferred, the invention can be practiced using thicker first dielectric barrier layers 206. This first dielectric barrier layer 206 is treated (e.g., plasma treated) to improve its adhesion to the copper layer 201. Good adhesion refers to high interfacial adhesion energy between two adjacent layers. In accordance with the principles of the invention, the first dielectric barrier layer 206 has greater adhesion to copper than the second dielectric barrier layer 207. Suitable materials and processes used for forming a suitable first dielectric barrier layer 206 will be discussed in detail hereinbelow.

As above, the dielectric barrier stack 205 includes a second portion formed on the first portion. In this implementation the second portion comprises a second dielectric barrier layer 207 formed on the plasma treated first dielectric barrier layer 206. The second dielectric barrier layer 207 can be formed using ordinary dielectric barrier materials and formed to a much greater thickness than the first dielectric barrier layer 206. Typically, the second dielectric barrier layer 207 is formed using the same dielectric barrier materials as are used to form the first dielectric barrier layer 206 with the exception that the second dielectric barrier layer 207 is not treated to enhance its adhesion properties. Alternatively, the second dielectric barrier layer 207 is formed using different materials than are used to form the first dielectric barrier layer 206.

Again referring to FIGS. 1(a) and 1(b), during ordinary course of operation, the copper layer 107 in the via demonstrates a high density of copper (Cu) ion flux. The presence of the barrier layers 110 and 111 contributes significantly to the formation of voids at the metal/via interconnect. It has been discovered that one significant contributory factor in electromigration problems in copper layers is the poor adhesion between the barrier layers 110, 111 and the associated copper conducting layers. An aspect of the present invention is directed to reducing the incidence of voiding and circuit failure in copper conducting structures and forming dielectric barrier layers that result in improved electromigration lifetimes for copper conducting structures in semiconductor devices.

The inventors have discovered that improved adhesion between a dielectric barrier layer 111 and a copper-containing layer (e.g., 107) can result in a structure having a significantly improved electromigration lifetime. The inventors have discovered structures and fabrication methodologies related to improved dielectric barrier layers, examples of which are disclosed herein. In one such embodiment, an improved dielectric barrier stack having good adhesion to copper and good dielectric performance is disclosed. In another related embodiment, an improved dielectric barrier stack having even greater adhesion to copper at the cost of slightly reduced dielectric performance is disclosed. Such embodiments can be fabricated by plasma treating portions of the dielectric barrier stack with a plasma that includes desired elements. In another related embodiment, an improved dielectric barrier stack having improved adhesion to copper and improved dielectric performance is fabricated by ion implanting selected ions.

FIGS. 3(a)-3(e) illustrate one method embodiment used for constructing an improved via/interconnect structure in accordance with the principles of the invention. FIG. 3(a) depicts one example of a suitable substrate in readiness for the formation of such an improved via/interconnect structure. The substrate 300 typically comprises a copper line 311 over which barrier layers are formed. In the depicted embodiment, the conducting layer is a copper layer. One barrier layer 312 is a dielectric barrier layer that is formed over the conducting layer 301. In other embodiments the barrier layer 312 can be formed of dielectric barrier materials. An insulating layer 315 is formed on the substrate surface having an opening 314 formed therein. Such an opening 314 permits the electrical connection with upper conducting layers with lower conducting layers. The insulating layer 315 is commonly formed of electrically insulating materials and is also referred to as an inter-layer dielectric (ILD). In many embodiments the ILD 315 is formed of low-K dielectric materials or other electrically isolating materials. The principles of the present invention find particular utility when applied to use with low-K dielectric materials. Examples of such materials include spin-on and CVD polymeric materials based on silicon or carbon, or based on combinations of silicon and carbon. Particular low-K materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include SiCOH or polymers of parylene and napthalene, copolymers of parylene with polysiloxanes or teflon, and polymers of polysiloxane. Other materials include, but are not limited to, silicon dioxide or combinations of silicon dioxide and other doped dielectrics (e.g., BPSG, PSG).

Openings 314 are formed in the ILD 315 to expose the underlying conducting layers. Such openings 314 are typically formed using methodologies well known to those having ordinary skill in the art. Suitable techniques include, but are not limited to, damascene and dual damascene fabrication processes. The openings expose a portion of the underlying copper layer 311. Another copper diffusion barrier 313 is formed in the opening 314 to prevent copper material from diffusing into the ILD 315. In some implementations, the copper diffusion barrier 313 is formed of a metal barrier material to form a metal barrier layer.

A copper conducting layer (or plug) 301 is then formed in the opening 314 to create an interconnect structure to the underlying copper line 311. The copper layer 301 can be comprise of a wide range of copper-containing materials. One typical example is a copper layer 301 that is comprised substantially of copper. However, the inventors point out that such copper layers 301 can include, without limitation, copper alloy materials, multi-layer structures containing copper, as well as other like materials. Thus, the substrate 300 depicted in FIG. 3(a) provides one suitable embodiment of a starting substrate. Additionally, many other substrates having copper layers can enjoy the benefits of the invention.

Reference is now made to FIG. 3(b). In many applications, the substrate is now pre-cleaned to remove native oxides. In particular, such pre-cleaning is employed to remove a thin layer of copper oxide from the exposed portion of the copper layer 301. A typical approach for pre-cleaning involves plasma treating the surface with a plasma 320 of reducing gases (e.g., $NH_3$ and $H_2$). Additionally, the surface can be treated with a plasma 320 formed using argon, hydrogen, or carbon fluoride ($CF_x$) materials. Such plasma cleaning should be conducted until about 50 Å of oxide are removed from the copper layer 301. Techniques for achieving such pre-cleaning are known to persons having ordinary skill in the art. This substrate can have a dielectric barrier stack in accordance with the principles of the invention formed thereon.

FIG. 3(c) illustrates one portion of the process of forming a dielectric barrier stack in accordance with the principles of the invention. A first dielectric barrier layer 206 is formed on the on the substrate. In particular, the first dielectric barrier layer 206 is formed having a relatively thin dimension with a layer thickness of about 50-100 Å thick. In alternative embodiments, a thicker first dielectric barrier layer 206 can be employed.

One suitable process for applying the first dielectric barrier layer 206 is plasma enhanced chemical vapor deposition. Other techniques, such as standard chemical vapor deposition processes can be used. Suitable machines for accomplishing such layer formation include chemical vapor deposition (CVD) or plasma enhanced chemical vapor deposition (PECVD) machines. Examples of satisfactory machines are Sequels (manufactured by Novellus Systems, Inc. of San Jose, Calif.); Centura 5000 or Producer (manufactured by Applied Materials, Inc. of Santa Clara, Calif.); or Trikon FXP (manufactured by Trikon Technologies, Inc. of the United Kingdom).

In accordance with one embodiment of the present invention, a silicon carbide material or a silicon oxycarbide material can be used to form a preferred first dielectric barrier layer 206. Silicon carbide, for purposes of this patent, is a generic name given to a class of materials comprising amorphous hydrogenated silicon carbides. Also, for purposes of this patent, silicon oxycarbide is a generic name given to a class of materials comprising amorphous hydrogenated silicon oxycarbides. The following discussion is directed toward one example of a method of forming such layers. In a plasma enhanced chemical vapor deposition (PECVD) process a substrate 300 is positioned in a processing chamber of a PECVD machine and appropriate reactant materials are flowed into the chamber. The reactant materials are ignited into plasma and a dielectric barrier material is deposited to form layer 206.

Suitable precursor materials include silicon-containing materials and methylated materials. For example, methane and silane can be flowed and ignited together to achieve desired films. Another class of precursor materials are methyl silanes. For example, 4-methylsilane ($Si(CH)_4$, also known as 4MS), 3-methylsilane ($Si(CH)_3H$, also known as 3MS), 2-methylsilane ($Si(CH)_2H$, also known as 2MS), and also 1-methylsilane ($Si(CH)H_3$, also known as 1MS). In one exemplar process, precursor materials are flowed into the process chamber with an inert carrier gas (e.g., argon (Ar) or helium (He)). Additionally, if a silicon oxycarbide layer is desired, another reactant, oxygen ($O_2$) gas is flowed into the chamber. For example, $Si(CH)_3H$ (3MS) is flowed into the chamber with an Ar carrier gas while $O_2$ gas is flowed into the chamber.

In one suitable process embodiment, a silicon carbide dielectric barrier layer 206 is formed by flowing 3MS into the chamber at a rate of about 400 SCCM (standard cubic centimeter per minute) with an Ar carrier gas flow rate of about 1500 SCCM. The forgoing embodiment is but one preferred implementation. 3MS flow rates can range from about 10 SCCM to about 1000 SCCM. Carrier gas flow rates can range from about 50 SCCM to about 3000 SCCM. Additionally, $O_2$ gas flow rates can range from about 10 SCCM to about 1000 SCCM, in order to achieve suitable silicon oxycarbide dielectric barrier layers. As the materials are flowed into the process chamber, a pressure in the range of about 0.1-10 Torr, preferably about 6 Torr is maintained. A plasma is then ignited in the chamber. A suitable plasma ignition power ranges from about 200 watts (W) to about 600 W, with a preferred power being about 300 W. After plasma ignition, a silicon carbide can be deposited to a desired thickness, with preferred thicknesses being in the range of about 50 Å to about 100 Å. But as indicated hereinabove, thicknesses of greater than 100 Å can also be used. One typical process takes about 5 seconds to deposit a silicon carbide first dielectric barrier layer 206 to about 100 Å. It should be noted that many other techniques can be used to fabricate suitable dielectric barrier layers (e.g., See, U.S. Pat. No. 5,926,740 to Forbes, et al. which describes methods of SiOC and SiC formation).

Alternatively, silicon nitrides ($Si_xN_y$) and silicon carbon nitrides ($Si_xC_yN_z$) or other like materials can be used to form suitable first dielectric barrier layers 206. Such dielectric barrier layers 206 can be formed using conventional approaches. For example a silicon nitride dielectric barrier layer 206 can be formed using PECVD, CVD, physical vapor deposition (PVD) or atomic layer deposition (ALD) techniques The thin first dielectric barrier layer 206 is then plasma treated with appropriate adhesion enhancing materials to increase the adhesion of the dielectric barrier layer 206 to the underlying copper layer 301. This can be accomplished using the same process tools used to form the dielectric barrier layer 206. Examples of such adhesion enhancing materials include, but are not limited to, carbon, nitrogen, hydrogen, phosphorus, sulfur as well as other materials that result in increased adhesion to copper. Of particular utility are carbon and nitrogen containing materials. Typically, such adhesion enhancement can be had by plasma treating the first dielectric barrier layer 206 with a plasma having a high concentration of adhesion enhancing ions. Such plasma treatment increases the concentration of such materials in a first dielectric barrier layer 206. As a result, the adhesion of the first dielectric barrier layer 206 to copper can be increased. This has the effect of reducing the effect of copper electromigration and void induced circuit failure.

With reference to FIG. 3(d) an example plasma treatment process is disclosed. In one suitable process embodiment, a first dielectric barrier layer 206 plasma treated by flowing a suitable adhesion enhancing materials (e.g., a carbon or nitrogen containing material) into the chamber and then igniting the material to form a plasma 350. The plasma 350 interacts with the first dielectric barrier layer 206 to increase the concentration of the desired materials in the first dielectric barrier layer 206. Plasmas demonstrating a relatively high mean free path (MFP) are desired. Such plasmas can be achieved using relatively low pressure processes.

If the process engineer decides to increase the nitrogen content of the first dielectric barrier layer 206, nitrogen-containing materials such as $N_2$, $NH_3$, or other nitrogen-containing materials can be used. A less preferred, but still useful implementation uses nitrogen-containing materials having oxygen (e.g., $N_2O$). In an alternative approach carbon-containing materials can be used. Typical examples, include, but are not limited to, hydrocarbons. A preferred implementation uses materials such as $CH_4$, $C_2H_6$, $C_3H_8$, and so on. A less preferred, but still useful implementation uses carbon-containing materials having oxygen (e.g., $CO$, $CO_2$). Additionally, both the carbon and nitrogen content of the first dielectric barrier layer 206 can be increased. Additionally, in some implementations it is advantageous to flow sulfur and/or phosphorus containing compounds into the chamber to increase the sulfur or phosphorus content of the first dielectric barrier layer 206. Such films also demonstrate increased adhesion to copper.

In one example process, an $N_2$ gas is flowed into the chamber at a flow rate of in the range of about 2 SCCM to about 5000 SCCM. In one example, $N_2$ gas is flowed into the chamber at rate of about 400 SCCM. The pressure should be maintained at a range of about 1 mTorr to 10 Torr. A plasma is then ignited in the chamber. A suitable plasma ignition power ranges from about 50 watts (W) to about 3000 W, with a preferred power being about 100 W with pressure of about 100 mTorr. After plasma ignition, the first dielectric barrier layer 206 is exposed to the nitrogen plasma. Optionally, the plasma can be subject to a low bias voltage (e.g., less than about 100V). Such exposure increases the nitrogen content of the first dielectric barrier layer 206. Similar process parameters can be used to increase the carbon, phosphorus, or sulfur content of the first dielectric barrier layer 206. A typical plasma treatment takes about 1 s (second) to about 60 s. A 5 second exposure is generally sufficient to achieve an effective concentration of adhesion enhancing materials. In particular, adhesion enhancing materials such as carbon and nitrogen are preferred because the increase the adhesion of first dielectric barrier layer 206 without substantially increasing the K value of the first dielectric barrier layer 206. Consequently, the adhesion is increased without a substantial sacrifice of dielectric performance in the first dielectric barrier layer 206.

As depicted in FIG. 3(e), after plasma treatment, a bulk second dielectric barrier layer 207 is formed on the first dielectric barrier layer 206. Typically, this second dielectric barrier layer 207 is formed having a much greater thickness than the thin first dielectric barrier layer 206. Typical thickness dimensions for the second dielectric barrier layer 207 are in the range of about 200 Å to about 500 Å. The second dielectric barrier layer 207 is typically formed out of the same material as the first dielectric barrier layer 206 prior to plasma treatment. However, the inventors contemplate that other dielectric barrier materials can be used to form the second dielectric barrier layer 207. In either case, the process parameters described herein above with respect to forming the first dielectric barrier layer 206 (See, FIG. 3(c) and the discussion pertaining thereto) can be implemented to form suitable second dielectric barrier layers 207.

FIGS. 4(a)-4(c) illustrate another method embodiment used for constructing an improved via/interconnect structure in accordance with the principles of the invention. FIG. 4(a) depicts a suitable substrate such as described earlier with respect to FIGS. 3(a) and 3(b). This substrate then has a first dielectric barrier layer 406 formed thereon. Such first dielectric barrier layers 406 are preferably formed using PECVD or atomic layer deposition (ALD) techniques. Such layers are preferably formed having a adhesion to underlying copper layers 301. SiCN and SiC layers are therefore preferred. However, other dielectric barrier materials can be used to form the first dielectric barrier layer 406. As will previous first dielectric barrier layers, such layers are preferrably formed having relatively thin having a layer thickness of about 50-100 Å thick. However, alternative embodiments having thicker first dielectric barrier layers 406 can be employed.

With reference to FIG. 4(b), an example plasma treatment process is disclosed. As with the previously described process embodiments, the first dielectric barrier layer 406 plasma treated by flowing a suitable adhesion enhancing materials (e.g., a carbon or nitrogen containing material) into the chamber and then igniting the material to form a plasma 450. The plasma 450 interacts with the first dielectric barrier layer 406 to increase the concentration of the desired materials in the first dielectric barrier layer 406. Such processes as previously described can be used. In such embodiments, where improved adhesion is desired at the cost of slightly reduced dielectric performance (i.e., the K is increased) adhesion enhancing materials having lower hydrogen content can be used. Particularly attractive in such implementations are nitrogen-containing materials such as $N_2$ gas. In less preferred alternatives, nitrogen-containing materials having oxygen (e.g., $N_2O$) can be used. Additionally, carbon-containing materials having oxygen (e.g., $CO$, $CO_2$) are useful. Additionally, sulfur and/or phosphorus containing compounds can be flowed into the chamber to increase the sulfur or phosphorus content of the first dielectric barrier layer 406. Such films demonstrate increased adhesion to copper at the cost of moderately decreased dielectric performance. Generally, such reduced dielectric performance is offset by the fact that the first dielectric barrier layer 406 is very thin. Thus, a great deal of the dielectric performance of the resulting dielectric barrier stack is provided by the low K second dielectric barrier layer. Such dielectric barrier stacks have still longer electromigration lifetimes.

Once the first dielectric barrier layer 406 is formed and plasma treated, a second dielectric barrier layer 407 is formed to complete the dielectric stack 408. Such a structure is depicted in FIG. 4(c). Such second dielectric barrier layers 407 can be formed as described in the discussions of FIG. 3(e). As previously discussed such second dielectric barrier layers 407 can be bulk deposited having a greater thickness than the first dielectric barrier layer 406. Thus, the slightly reduced dielectric performance (i.e., higher K) of the first dielectric barrier layer 406 is offset by the fact that dielectric stack 408 also includes a second dielectric barrier layer 407 having superior dielectric performance (i.e., lower K) and greater thickness. Thus, the first dielectric barrier layer 406 provides superior adhesion to the copper layer 301 while the second dielectric barrier layer 407 provides low K. Thus the resulting dielectric barrier stack 408 reaps the benefits of both superior adhesion to copper and low K.

In yet another embodiment, the structure depicted in either FIG. 3(c) or FIG. 4(a) can be used as the starting point. Such structures being formed by any of the previously disclosed methods or other suitable methods. The embodiment depicted in FIG. 5(a) includes a substrate 500 having been formed, for example, as in the processes leading up to either FIG. 3(c) or FIG. 4(a). The substrate 500 is shown with a copper layer 301 having a first dielectric barrier layer 506 formed thereon. As explained such layers 506 can be formed using methods already described.

Referring to FIG. 5(*b*) the concentration of adhesion enhancing materials (such as previously described) in the first dielectric barrier layer 506 is enhanced by means of ion implantation. Adhesion enhancing ions 501 (e.g., carbon, nitrogen, hydrogen, phosphorus, sulfur, and other materials that enhance the adhesion of dielectric barrier layers to copper) are implanted into the first dielectric barrier layer 506 to increase the concentration of such materials in the first dielectric barrier layer 506. Since the first dielectric barrier layer 506 is relatively thin, low implantation energies are all that is required to increase the concentration of such materials in the first dielectric barrier layer 506. For example, in a first dielectric barrier layer 506 having a thickness of about 100 Å an ion implantation energy for nitrogen ions is in the range of about 1000 eV (electron volts) to about 100,000 eV. Effective dosages are in the range of about $1\times10^{16}$ to about $2\times10^{20}$ ions per cm$^2$.

Additionally, as depicted in FIG. 5(*b*), by selectively adjusting the implantation voltages used for implantation of the adhesion enhancing materials, the implanted adhesion materials can be preferentially located in a desired implantation region 502 (indicated by the X's) right at the interface between the first dielectric barrier layer 506 and the copper layer 301. Thus, the adhesion enhancing materials can be concentrated right at the location where they will have the most effect adhesion enhancing effect. Additionally, by making the desired implantation region 502 very narrow, the effect on the dielectric properties of the first dielectric barrier layer 506 is also reduced. The precise energies required to accomplish such implantation depend on a number of factors known to persons having ordinary skill in the art and include, but are not limited to thickness of the first dielectric barrier layer 506, type of ion implanted, depth and width of the desired implantation region 502 as well as other factors.

FIG. 5(*c*) schematically depicts the next step in the formation of the dielectric barrier stack 508. In FIG. 5(*c*), a second dielectric barrier layer 507 is formed on the first dielectric barrier layer 506 to complete the dielectric barrier stack 508. As described previously, such second dielectric barrier layers 507 can be formed using any of the methods previously described.

FIG. 5(*d*) depicts yet another embodiment related to that of FIGS. 5(*a*)-5(*c*). The depicted embodiment uses but a single dielectric barrier layer 510 formed at a final desired thickness. Generally, in the range of about 50 Å to about 1000 Å, preferably about 500 Å. The single dielectric barrier layer 510 is then implanted with adhesion enhancing ions 511 (e.g., carbon, nitrogen, hydrogen, phosphorus, sulfur, and other materials that enhance the adhesion of dielectric barrier layers to copper) increase the concentration of such materials. Such implantation can be accomplished as described hereinabove. Again, by selectively adjusting the implantation voltages used for implantation of the adhesion enhancing materials, the implanted adhesion materials can be preferentially located in a desired implantation region 512 (indicated by the X's) right at the interface between the single dielectric barrier layer 510 and the copper layer 301. Due to the greater thickness of the single dielectric barrier layer 510, the precise energies required to accomplish such implantation are correspondingly increased. Such a structure has the advantage of having high adhesion (adhesion energy) with copper and excellent dielectric properties. Such a structure provides increased electromigration lifetimes for circuit devices. The single dielectric barrier layer can be formed using dielectric barrier layer fabrication processes known to persons having ordinary skill in the art including, but not limited to fabrication methods discussed elsewhere in this patent.

Referring to FIG. 6, a semiconductor wafer is depicted. Typically, such wafers 601 having a multiplicity of integrated circuits (chips) 602 formed thereon. Each chip has many different types of circuit structures formed thereon. Accordingly, each chip 502 can include structures such as schematically depicted in FIGS. 2, 3(*e*), 4(*c*), 5(*c*) and 5(*d*) (shown schematically depicted here as interconnect structures 603) as part of its structure.

Thus, embodiments of the invention include dielectric barrier layers having increased amounts of adhesion enhancing materials formed in their structure. As a result, such structures improve the electromigration lifetimes of copper conducting structures incorporating such improved dielectric barrier layers.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that dielectric barrier layers in accordance with the principles of the present invention can be practiced with a number of different materials and formed by a wide variety of methods. Moreover, the adhesion enhancing materials used in conjunction with such dielectric barrier layers can be selected from among carbon, nitrogen, hydrogen, phosphorous, and sulfur containing materials, as well as other materials that enhance the adhesion of dielectric barrier layers to copper. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim

1. A copper interconnect structure having increased electromigration lifetime, the interconnect comprising:
    a semiconductor substrate;
    a copper layer formed on the substrate; and
    a dielectric barrier stack formed on top of the copper layer, said dielectric barrier stack including a first portion consisting of a single first barrier layer formed adjacent to the copper layer and a second portion consisting of a single second barrier layer formed on the single first barrier layer, the first portion having improved adhesion to copper relative to the second portion, the second portion having a lower κ value relative to the κ value of the first portion and both portions being formed having resistance to copper diffusion and wherein the first portion has increased concentration of at least one of phosphorus and sulfur relative to the second portion of the barrier stack.

2. A copper interconnect structure having increased electromigration lifetime, the interconnect comprising:
    a semiconductor substrate;
    a copper layer formed on the substrate; and a dielectric barrier stack formed on top of the copper layer, said dielectric barrier stack including a first portion formed adjacent to the copper layer and a second portion formed on the first portion, the first portion having improved adhesion to copper relative to the second portion, the second portion having a lower κ value relative to the κ value of the first portion and both portions being formed having resistance to copper diffusion;

wherein the both portions of the barrier stack are each comprised of a material selected from among silicon carbide, silicon carbon nitride, silicon dioxide, and silicon nitride; and wherein the first portion is formed having increased adhesion to the copper layer achieved by having a greater concentration of at least one of phosphorus and sulfur relative to the second portion of the barrier stack.

3. The structure of claim 1 wherein the first portion has been ion implanted to increase its concentration of at least one of phosphorus and sulfur relative to the second portion of the barrier stack thereby increasing its adhesion to copper and increasing its dielectric constant relative to the second portion of the stack and wherein the second portion comprises a thicker dielectric barrier layer comprised of a dielectric barrier material that has not been ion implanted in the same way as the first portion.

4. A semiconductor integrated circuit incorporating the structure of claim 3.

5. A copper interconnect structure having increased electromigration lifetime, the interconnect comprising:

a semiconductor substrate;

a copper damascene structure formed in recesses formed in the substrate;

a first barrier layer having first portion formed on top of the semiconductor substrate and in contact with the copper damascene structure and having good adhesion to the copper of the copper damascene structure and having resistance to copper electromigration and also having a first κ value; and the barrier layer including a second portion arranged in contact with and above the first portion and having a second κ value and having resistance to copper electromigration, the first portion including a concentration of dopant materials wherein said dopant materials include at least one of phosphorus and sulfur.

6. A copper interconnect structure having increased electromigration lifetime, the interconnect comprising:

a semiconductor substrate;

a copper damascene structure formed in recesses formed in the substrate;

a first barrier layer formed on top of the semiconductor substrate and in contact with the copper damascene structure, the first barrier layer having good adhesion to the copper of the copper damascene structure and having resistance to copper electromigration and also having a first κ value;

a second barrier layer formed on top of the semiconductor substrate and in contact with the first barrier layer and having a second κ value and having resistance to copper electromigration;

said first and second layers comprising a dielectric barrier stack with the first barrier layer having improved adhesion to copper relative to the second barrier layer, and wherein the second κ value of the second barrier layer has a lower value than the first κ value of the first barrier layer and having improved resistance;

wherein the first and second layers of the barrier stack are each comprised of a material selected from among silicon carbide, silicon carbon nitride, silicon dioxide, and silicon nitride; and wherein the first barrier layer has a greater concentration of at least one of phosphorus and sulfur relative to the second barrier layer thereby increasing the adhesion of the first barrier layer to copper relative to the second barrier layer.

7. The structure of claim 6 wherein the first barrier layer is formed of a very thin profile of in the range of about 50 Å to about 100 Å.

8. The structure of claim 6 wherein the first barrier layer is formed of a very thin profile of about 50 Å.

9. The structure of claim 6 wherein the second barrier layer is formed to a greater thickness than the first barrier layer.

10. The structure of claim 6 wherein the second barrier layer is formed to a thickness in the range of about 200 Å to about 1000 Å.

11. The structure of claim 6 wherein the first barrier layer has a greater concentration of phosphorus relative to the second barrier layer.

12. The structure of claim 6 wherein the first barrier layer has a greater concentration of sulfur relative to the second barrier layer.

13. A semiconductor integrated circuit incorporating the structure of claim 3.

14. A semiconductor integrated circuit incorporating the structure of claim 6.

* * * * *